United States Patent [19]
Sherman

[11] 3,968,445
[45] July 6, 1976

[54] DIGITAL PULSE WIDTH DOUBLER

[75] Inventor: Walter R. Sherman, Panama City, Fla.

[73] Assignee: The United States of America as represented by the Secretary of the Navy, Washington, D.C.

[22] Filed: Apr. 29, 1974

[21] Appl. No.: 466,430

[52] U.S. Cl. ............................. 328/58; 307/265; 307/267
[51] Int. Cl.² ..................... H03K 5/04; H03K 1/18
[58] Field of Search ............ 328/58; 307/267, 225, 307/265

[56] References Cited
UNITED STATES PATENTS

| | | | |
|---|---|---|---|
| 3,564,220 | 2/1971 | Peddie et al. | 307/225 X |
| 3,579,146 | 5/1971 | Cohen | 328/58 |
| 3,753,126 | 8/1973 | Hines et al. | 307/225 X |
| 3,820,029 | 6/1974 | McKinley | 328/58 |
| 3,836,858 | 9/1974 | Kitano | 328/58 |

*Primary Examiner*—Malcolm F. Hubler
*Attorney, Agent, or Firm*—Richard S. Sciascia; Don D. Doty; Harvey A. David

[57] ABSTRACT

A pulse-width doubler is disclosed as comprising a bistable multivibrator having a first input, a second input, and an output, for producing a first signal at the output thereof in response to a predetermined second signal being supplied to the first input thereof and for producing a third signal that is different from said first signal at the output thereof in response to a predetermined fourth signal being supplied to the second input thereof. A digital counter and storer, having an up-count input, a down-count input, a zero reset input, and an output, with the output thereof connected to the aforesaid second input of said first and third signals producing means, for up-counting the pulses of a pulsed fifth signal being supplied to the up-count input thereof, for down-counting the pulses of said up-counted pulses in response to a pulsed fixed signal being supplied to the down-count input thereof, and for producing the aforesaid fourth signal at the output thereof immediately after the aforesaid down-counting of said up-counted pulses have been completed. A steering generator, having an input and a pair of outputs, with the input thereof connected for response to the aforesaid predetermined second signal and with the pair of outputs thereof respectively connected to the up-count and down-count inputs of the aforesaid up-counting and down-counting signal counter and storer, for respectively generating and supplying said pulse fifth and sixth signals thereto in response to said first and third signals. A reset monostable multivibrator, having an input connected for response to said second signal and an output connected to the zero reset input of said up and down pulsed counter and storer for supplying a zero reset signal thereto in immediate response to said second signal.

15 Claims, 2 Drawing Figures

DIGITAL PULSE WIDTH DOUBLER

STATEMENT OF GOVERNMENT INTEREST

The invention described herein may be manufactured and used by or for the Government of the United States of America for Governmental purposes without the payment of any royalties thereon or therefor.

FIELD OF THE INVENTION

The present invention pertains, in general, to data signal processors and is, in particular, a method and means for producing correlation gate pulses whose time period tracks the period of a given signal at a fixed ratio over a wide dynamic range. In even greater particularity, the invention comprises a digital pulse width doubler over a wide dynamic frequency range.

DESCRIPTION OF THE PRIOR ART

Heretofore, pulse width doublers have been of the analog type; therefore, although satisfactory for some operational situations, for numerous operational situations, they leave something to be desired, especially from the standpoints of accuracy and versatility. Moreover, the dynamic frequency range thereof is ordinarily too narrow for them to be useful as an adjunct to associated digital systems. In addition, the various and sundry parameters thereof cause severe limitations to exist with respect thereto, as far as their combination possibilities with digital and other apparatus are concerned. Furthermore, they are ordinarily of such size and complexity as to be unwieldy and bulky by comparison.

SUMMARY OF THE INVENTION

The present invention overcomes some of the disadvantages of the prior art devices for many practical purposes. Obviously, one of its advantages is its very simplicity of structure; but even more important is its extreme accuracy and its small (miniaturized) size.

Briefly, on one hand, clock pulses are continuously fed through a clock steering gate to the countdown input of a chain of cascaded decade counters whenever no pulses occur at the signal input terminal of the invention. In such case, "borrow" pulses are generated at the output of the last decade counter, so as to provide a reset pulse for an input flip-flop, thereby holding its output low (that is, to logic 0).

On the other hand, when an input pulse does occur at the input terminal of the invention, its leading edge 1 triggers a reset monostable multivibrator, which, in turn, resets all of the decade counters to zero; 2 sets the flip-flop, causing its output to go high; and 3 switches a clock steering gate. The decade counters are clocked up N pulses which represent the period of the pulse of the input signal, and when the input pulse terminates, the decade counters are again clocked down. When the decade counters have been clocked down to zero, a borrow pulse is generated by the last one thereof which resets the flip-flop, causing its output to go low. The output pulse of the flip-flop, of course, will always be doubled in period of that of the input signal pulse within the design frequency limits of the invention, and because of its digital generation, it is extremely accurate in time.

It is, therefore, an object of the invention to produce an improved method and means for generating coincidence gate pulses from digital correlation circuits.

Another object of this invention is to provide an improved method and means for generating correlation gate pulses whose period tracks the pulse period of an input signal at a fixed ratio over a wide dynamic frequency range.

Still another object of this invention is to provide an improved digital pulse width doubler.

Another object of this invention is to provide a digital pulse width doubler whose dynamic frequency range is a function of a predetermined clock rate, the minimum period of the input pulse, and the number of decade counters utilized.

A further object of this invention is to provide a digital pulse width doubler having no frequency drift, requiring no adjustments, and is exceedingly accurate throughout its dynamic range.

Another object of this invention is to provide a digital pulse width doubler which, relatively speaking, is small in size because it is susceptible to being manufactured by using integrated circuits.

Still another object of this invention is to provide an improved digital pulse width doubler that is easily and economically manufactured, transported, operated, maintained, and stored.

Other objects and many of the attendant advantages will be readily appreciated as the subject invention becomes better understood by reference to the following detailed description, when considered in conjunction with the accompanying drawings.

DESCRIPTION OF THE PREFERRED EMBODIMENT

Figure 1:
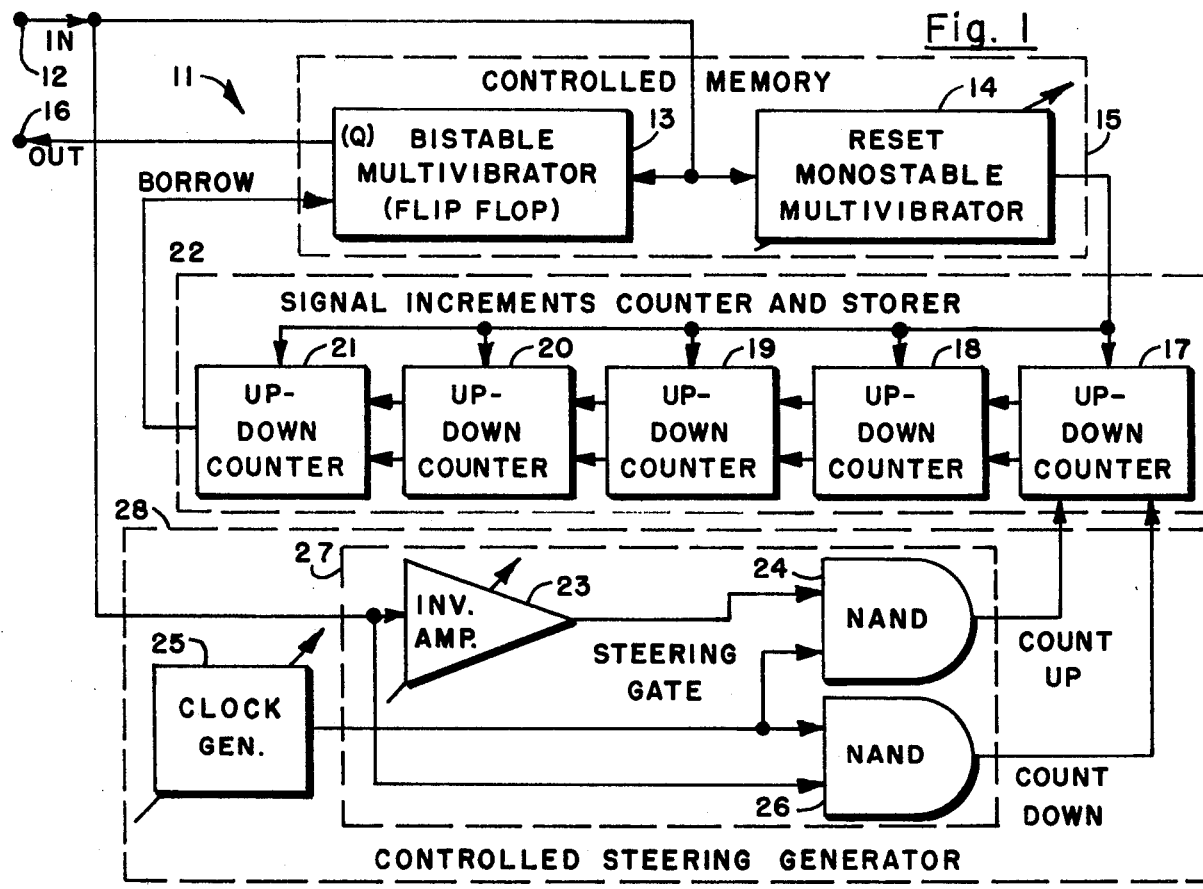
FIG. 1 is a block diagram of the improved digital pulse width doubler constituting this invention.

Referring now to FIG. 1, there is shown a digital pulse width doubler 11 as including an input signal terminal 12 which is connected to the "set" input of a bistable multivibrator (flip-flop) 13 and a reset monostable multivibrator 14, the latter of which combine in such manner as to form controlled memory circuit 15. Of course, bistable multivibrator 13 and reset monostable multivibrator 14 may be designed to be manually or otherwise adjustable, so as to allow the operational program to effectively be varied as desired. However, in this particular case, it is preferable that bistable multivibrator 13 be designed to produce a logic "0" at the output thereof whenever a logic "1" is supplied to the data signal input thereof.

The "Q" output of said bistable multivibrator 13 is connected to an output terminal 16 which, in turn, constitutes the output of the invention.

The output of reset monostable multivibrator 14 is connected to the reset inputs of a plurality of cascaded up-down decade counters 17 through 21. Up-down counters 17 through 21 are optionally of the SN74192 decade type manufactured by the Texas Instrument Company of Dallas, Tex. In any event, they should be of the type that are capable of being cleared to a zero count—and only to a zero count—by a predetermined reset signal, and of the type that puts out a "borrow" pulse immediately after an actual count down to zero operation - and only after an actual count down operation has occurred. In other words, from a functional standpoint, a borrow pulse occurs on the negative transition of the clock pulse when the last down counter mode is switching between zero and nine. For most practical purposes, such operation, in actuality, constitutes a down count and a tiny little bit more, with said tiny little bit constituting an error period. However, when such error period is compared with the down count period - and especially the up count period plus the down count period - it becomes negligible and has no significance from a practical, real time, operational standpoint. In this particular embodiment, only five up-down counters are employed; however, it should be understood that any number thereof may be incorporated in the invention as dictated by operational circumstances. It, of course, would be obvious to one skilled in the art having the benefit of the teachings presented herewith to make whatever design selection and arrangement of the aforesaid up-down counters as would optimize the invention for any given operational circumstances.

In the interconnection and interaction arrangement shown, it may be said that up-down counters 17 through 21 constitute a signal increments counter and storer circuit 22.

The borrow output of up-down counter 21 - in this case, the last one of the aforesaid cascaded up-down counters - is connected to the reset input of the aforesaid bistable multivibrator 13 of programmer circuit 15.

Also effectively connected to input signal terminal 12 is the input of an inverter amplifier 23, the output of which is connected to one of the inputs of a NAND gate 24. The output of NAND gate 24 is connected to the count up input of the aforesaid up-down counter - which, as may readily be seen, is the first up-down counter of the cascaded up-down counters of the aforementioned signal increments counter and storer circuit 22.

An adjustable frequency clock signal generator 25 - the frequency of which is preferably 1 KHz - has its output connected to the other input of NAND gate 24 and to one of the inputs of another NAND gate 26. The other input of NAND gate 26 is connected to the input of inverter 23 and, thus, is effectively connected to the aforementioned signal input terminal 12, while the output thereof is connected to the count-down input of the aforesaid up-down counter 17 of signal increments counter and storer circuit 22.

As may readily be seen, the interconnection and interaction arrangement of inverter amplifier 23 and NAND gates 24 and 26 constitute a steering gate 27, and when said elements are combined with clock pulse generator 25 they then constitute a data signal controlled generator.

At this time, it would appear to be noteworthy that all of the elements and components depicted in block form in FIG. 1 are well known, conventional, and commercially available. It should, therefore, be considered that it is their interconnections and interactions that effects the new and unique combination of elements constituting the digital pulse width doubler of this invention and produces the improved results effected thereby.

MODE OF OPERATION

The operation of the invention will now be discussed briefly in conjunction with both figures of the drawing.

Figure 2:
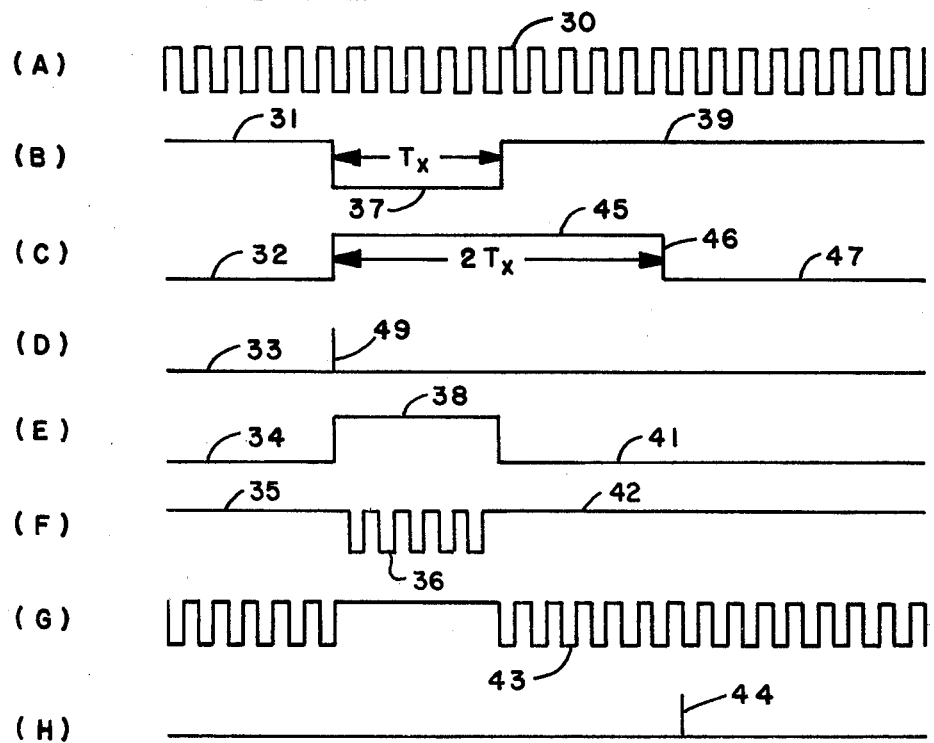
FIG. 2 is a graphical representation of various and sundry idealized waveforms of the output signals which emanate from various ones of the components of the device of FIG. 1, respectively.

For the purpose of this discussion, let it be assumed that a clock pulse signal similar to FIG. 2(A) is employed as the basic timing operative and is supplied by clock generator 25. In addition, let it be assumed that a signal similar to that shown in FIG. 2(B) is a typical representation of the type of signal supplied to input terminal 12 and, hence, to the data signal inputs of bistable multivibrator 13 and reset monostable multivibrator 14. Furthermore, for the purpose of this discussion, let it be assumed that the upper portion of the "squarewave" signal of FIG. 2(B) is a logic 1 and the lower portion thereof is a logic 0.

In the foregoing case, in the beginning (going from left to right as shown in FIG. 2(B)), a logic 1 signal portion 31 is being supplied to the data signal inputs of the aforesaid bistable multivibrator 13 and reset monostable multivibrator 14. Because bistable multivibrator 13 is designed to produce a logic 0 output (or no output) signal from its Q output whenever a 1 is supplied to the data signal input thereof, at the time of signal portion 31, nothing happens therein to cause it to change state. As a result, the Q output signal therefrom supplied to output terminal 16 remains in the 0 state, as represented by signal portion 32 of the waveform of FIG. 2(C).

Of course, as readily may be seen, whenever the 1 signal is being supplied to bistable multivibrator 13, it is also being supplied to the data signal input of reset monostable multivibrator 14. But because reset monostable multivibrator 14 is designed to not be activated by a logic 1 signal, the output thereof remains at a logic 0 level for the duration of signal portion 31, as may best be seen in signal 33 of the waveform of FIG. 2(D).

At the same time the logic 1 signal 31 exists, it is also being supplied to the input of inverter amplifier 23 and to one of the inputs of NAND gate 26 of the aforementioned steering gate 27. Thus, the signal of FIG. 2(B) is logically inverted by inverter amplifier 23 (and, in addition, amplified to some optimum operable level), as shown in representative fashion in signal portion 34 of the waveform of FIG. 2(E), and is supplied to one of the inputs of NAND gate 24. Moreover, at the same time, clock pulses from clock generator 25, similar to those depicted in FIG. 2(A), are being constantly supplied to the other inputs of NAND gates 24 and 26.

In accordance with conventional NAND gate logic, it may readily be seen that when a 1 signal from inverter 23 and a 1 signal from clock generator 25 are simultaneously applied to the inputs of NAND gate 24, a 0 signal occurs at the output of said NAND gate 24; when a 0 signal from inverter 23 and a 1 signal from clock generator 25 are simultaneously applied to the inputs of NAND gate 24, a 1 signal occurs at the output of said NAND gate 24; and when a 0 signal from inverter 23 and a 0 signal from clock generator 25 are simultaneously applied to the inputs of NAND gate 24, a 1 signal occurs at the output of said NAND gate 24. Hence, a signal similar to the waveform of FIG. 2(F) is timely developed at the output of NAND gate 24, since it changes from level 35 to level 36 at the pulse frequency of clock generator 25.

From the foregoing, it may be seen that, in effect, the duration or period of signal 37 - the 0 portion of the signal waveform of FIG. 2(B) - controls the duration of the period which the signal of FIG. 2(E) contains a logic 1 portion 38, which, in turn, controls the number of clock pulses which effectively pass through NAND gate 24. Therefore, it may readily be seen that said number of clock pulses - now up-count pulses 36 - are proportional to 0 signal period 37 of FIG. 2(B).

When the input signal represented by FIG. 2(B) reverts to a logic 1 condition 39, NAND gate 24 is closed because the 1 control signal 38 from inverter 23 changes to a 0 control signal 41, and, of course, the closure of NAND gate 24 stops the up-count pulses 36 from being produced, so the output thereof reverts to a 0 signal 42. However, at the same time 0 signal 37 reverts to 1 signal 39, NAND gate 26 is opened, because an opening control signal 39 is applied to one of the inputs thereof, and at the same time said 1 signal continued to be supplied to one of the inputs of NAND gate 26, a continuous succession of 1, 0, 1, 0, and so on, signals are supplied to the other input thereof. Hence, NAND gate 26 effectively opens and closes in accordance with conventional NAND gate logic and, thus, timely passes the clock pulses 43 to the down-count input of up-down counter 17, thereby causing it and incremental up-down counters 18 through 21 to count down to zero - that is, count down the same number of clock pulses (see FIG. 2(G) that it previously counted up - immediately after which a borrow pulse 44 similar to that shown in FIG. 2(H) is produced by up-down counter 21. Borrow pulse 44 is supplied to bistable multivibrator 13 to effect the resetting thereof. Hence, for the total time of the up and down count time periods, bistable multivibrator 13 was "set" and produced logic 1 signal portion 45 of FIG. 2(C) at the Q output thereof. Of course, the trailing edge 46 thereof occurs as a result of the resetting of bistable multivibrator 13 by borrow pulse 44, and, thus, the waveform of FIG. 2(C) is changed back to a 0 condition 47 at that time.

In the event there happens to be a relatively long interval of time before another 0 occurs in the input signal of FIG. 2(B), counters 17 through 21 continue counting down because NAND gate 26 is effectively free running and supplying pulses thereto, except when NAND gate 24 is producing up count pulses) and timely causing up-down counter 21 to put out borrow pulses; however, since bistable multivibrator 13 has already been reset by the first one thereof, subsequent borrow pulses have no further effect thereon until such time that it has again been set by a 0 signal being supplied to the data signal input thereof.

Referring again to FIG. 2(D), it may readily be seen that a very short duration pulse 49 is produced by reset monostable multivibrator 14 in response to a 0 signal (signal portion 37 of FIG. 2(B)) being supplied to the input thereof. Said pulse 49 is simultaneously supplied to all of up-down counters 17 through 21 for the purpose of stopping them from continuing to count down and for setting them all to zero count, so they will be ready to count up in response to a new 0 signal 37 occurring in the input signal.

Speaking in general, the accuracy and dynamic range of the subject invention are functions of the clock frequency, the minimum period of the input pulse, and the number of up-down decade counters incorporated therein. For example:

% Accuracy (min.) = Tcp/Tin (min.)

and

N = Log [Tin(max)/Tcp]

where

Tcp = period of a clock pulse in seconds,

N = number of up-down decade counters employed, and

Tin = input signal pulse period.

Thus, if the subject system is required to be accurate within plus or minus one per cent minimum and has a five decade range requirement from Tin (min) of 10 microseconds to a Tin(max) of 1 second, a clock rate of 10 megahertz and five decade counters would be required. Accordingly, it may readily be seen that the number of components and the parameters employed therein may be varied by the artisan for the purpose of optimizing the subject system for any suitable operational purpose. Obviously, one skilled in the art having the benefit of the teachings presented herein would be able to make the proper design selection of such necessary components and parameters in order to provide such optimization.

Furthermore, other embodiments and modifications of the subject invention will readily come to the mind of one skilled in the art having the benefit of the teachings presented in the foregoing description and the drawings. It is, therefore, to be understood that this invention is not to be limited thereto and that said modifications and embodiments are intended to be included within the scope of the appended claims.

What is claimed is:

1. A pulse-width doubler, comprising in combination:
means, having a first input, a second input, and an output, for producing a first signal at the output thereof in response to a predetermined second signal being supplied to the first input thereof, and for producing a third signal that is different from said first signal at the output thereof in response to a predetermined fourth signal being supplied to the second input thereof;
means, having an up-count input, a down-count input, a zero reset input, and an output, with the output thereof connected to the aforesaid second input of said first and third signals producing means, for up-counting the pulses of a pulsed fifth signal being supplied to the up-count input thereof, for down-counting the pulses of said up-counted pulses in response to a pulsed sixth signal being supplied to the down-count input thereof, and for producing the aforesaid fourth signal at the output thereof immediately after the aforesaid down-counting of said up-counted pulses has been completed;
means, having an input and a pair of outputs, with the input thereof connected for response to the aforesaid predetermined second signal, and with the pair of outputs thereof respectively connected to the up-count and down-count inputs of the aforesaid up-counting and down-counting means, for respectively generating and supplying said pulsed fifth and sixth signals thereto in response to said second signal; and
means, having an input connected for response to said second signal and an output connected to the zero reset input of said up and down pulse counting means for supplying a zero reset signal thereto in immediate response to said second signal.

2. The device of claim 1, wherein said means, having a first input, a second input, and an output, for producing a first signal at the output thereof in response to a predetermined second signal being supplied to the first input thereof, and for producing a third signal that is different from said first signal at the output thereof in response to a predetermined fourth signal being supplied to the second input thereof comprises a bistable multivibrator.

3. The device of claim 1, wherein said means, having an up-count input, a down-count input, a zero reset input, and an output, with the output thereof connected to the aforesaid second input of said first and third signals producing means, for up-counting the pulses of a pulsed fifth signal being supplied to the up-count input thereof, for down-counting the pulses of said up-counted pulses in response to a pulsed sixth signal being supplied to the down-count input thereof, and for producing the aforesaid fourth signal immediately after the aforesaid down-counting of said up-counted pulses has been completed comprises a digital up-down counter.

4. The device of claim 1, wherein said means, having an up-count input, a down-count input, a zero reset input, and an output, with the output thereof connected to the aforesaid second input of said first and third signals producing means, for up-counting the pulses of a pulsed fifth signal being supplied to the up-count input thereof, for down-counting the pulses of said up-counted pulses in response to a pulsed sixth signal being supplied to the down-count input thereof, and for producing the aforesaid fourth signal immediately after the aforesaid down-counting of said up-counted pulses has been completed comprises a predetermined plurality of cascaded digital up-down counters.

5. The device of claim 1, wherein said means, having an up-count input, a down-count input, a zero reset input, and an output, with the output thereof connected to the aforesaid second input of said first and third signals producing means, for up-counting the pulses of a pulsed fifth signal being supplied to the up-count input thereof, for down-counting the pulses of said up-counted pulses in response to a pulsed sixth signal being supplied to the down-count input thereof, and for producing the aforesaid fourth signal immediately after the aforesaid down-counting of said up-counted pulses has been completed comprises a predetermined up-down counter.

6. The device of claim 1, wherein said means, having an up-count input, a down-count input, a zero reset input, and an output, with the output thereof connected to the aforesaid second input of said first and third signals producing means, for up-counting the pulses of a pulsed fifth signal being supplied to the up-count input thereof, for down-counting the pulses of said up-counted pulses in response to a pulsed sixth signal being supplied to the down-count input thereof, and for producing the aforesaid fourth signal immediately after the aforesaid down-counting of said up-counted pulses has been completed comprises a predetermined plurality of cascaded incremental up-down counters.

7. The device of claim 1, wherein said means, having an input and a pair of outputs, with the input thereof connected for response to the aforesaid predetermined second signal, and with the pair of outputs thereof respectively connected to the up-count and down-count inputs of the aforesaid up-counting and down-counting means, for respectively generating said pulsed fifth and sixth signals in response to said second comprises:
a steering gate having a pair of inputs and a pair of outputs, with one of the inputs thereof connected for response to the aforesaid second signal, and with the pair of outputs thereof connected to the up and down count inputs of said up and down count pulsed counting means, respectively; and
a clock generator connected to the other of said pair of inputs of the aforesaid steering gate.

8. The device of claim 1, wherein said means, having an input and a pair of outputs, with the input thereof connected for response to the aforesaid predetermined second signal, and with the pair of outputs thereof respectively connected to the up-count and down-count inputs of the aforesaid up-counting and down-counting means, for respectively generating said pulsed fifth and sixth signals in response to said first and third signal comprises:
an inverter having an input and an output, with the input thereof connected for response to said second signal;
a first NAND gate having a pair of inputs and an output, with one of the inputs thereof connected to the output of said inverter;
a second NAND gate having a pair of inputs and an output, with one of the inputs thereof connected to the input of said inverter; and
a clock signal generator connected to the other inputs of said first and second NAND gates.

9. The device of claim 1, wherein said means, having an input connected for response to said second signal and an output connected to the zero reset input of said up and down pulse counting means for supplying a zero reset signal thereto in immediate response to said second signal comprises a reset monostable multivibrator.

10. The device of claim 1, wherein said means, having an input and a pair of outputs, with the input thereof connected for response to the aforesaid predetermined second signal, and with the pair of outputs thereof respectively connected to the up-count and down-count inputs of the aforesaid up-counting and down-counting means, for respectively generating and supplying said pulsed fifth and sixth signals thereto in response to said second signal comprises a steering generator.

11. The invention of claim 10, wherein said steering generator comprises:
a steering gate having a pair of inputs and a pair of outputs, with one of the inputs thereof connected for response to the aforesaid second signal, and with the pair of outputs thereof connected to the up and down count inputs of said up and down pulse counting means, respectively; and
a clock generator connected to the other of said pair of inputs of the aforesaid steering gate.

12. A pulse-width doubler, comprising in combination:
an input terminal;
a bistable multivibrator having a data signal input, a borrow pulse input for the resetting thereof, and an output, with the data signal input thereof connected to said input terminal;
an output terminal connected to the output of said bistable multivibrator;
an inverter amplifier having an input and an output, with the input thereof connected to the aforesaid input terminal;
a first NAND gate having a pair of inputs and a count-up output, with one of the inputs thereof connected to the output of said inverter amplifier;

a second NAND gate having a pair of inputs and a count-down output, with one of the inputs thereof connected to the aforesaid input terminal;

a clock generator having an output which is connected to the other inputs of the aforesaid first and second NAND gates;

signal increments counter and storer means having an up-count input, a down-count input, a reset input, and a borrow pulse output, with the up-count input thereof connected to the up-count output of said first NAND gate, with the down-count input thereof connected to the down-count output of said second NAND gate, and with the borrow pulse thereof connected to the borrow pulse input of the aforesaid bistable multivibrator; and a reset monostable multivibrator having a data signal input and an output, with the data signal input thereof connected to the aforesaid input terminal, and with the output thereof connected to the reset input of said signal increments counter and storer means.

13. The device of claim 12, wherein said signal increments counter and storer means comprises at least one digital up-down counter having an up-count input, a down-count input, a reset input, and a borrow pulse output, with the up-count input thereof connected to the up-count output of said first NAND gate, with the down-count input thereof connected to the down-count output of said second NAND gate, with the reset input thereof connected to the output of said reset monostable multivibrator, and with the borrow pulse output thereof connected to the borrow pulse input of the aforesaid bistable multivibrator.

14. The device of claim 12, wherein said signal increments counter and storer means comprises a predetermined plurality of cascaded digital up-down counters.

15. The device of claim 12, wherein said signal increments counter and storer means comprises five series connected up-down counters.

* * * * *